(12) United States Patent
Ueda

(10) Patent No.: US 7,203,095 B2
(45) Date of Patent: Apr. 10, 2007

(54) METHOD FOR DETERMINING PROGRAMMING VOLTAGE OF NONVOLATILE MEMORY

(75) Inventor: Naoki Ueda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 43 days.

(21) Appl. No.: 11/251,059

(22) Filed: Oct. 14, 2005

(65) Prior Publication Data

US 2006/0083067 A1    Apr. 20, 2006

(30) Foreign Application Priority Data

Oct. 14, 2004    (JP)    ............................. 2004-299575

(51) Int. Cl.
*G11C 11/34*    (2006.01)
*G11C 16/04*    (2006.01)

(52) U.S. Cl. .............................. 365/185.18; 365/185.28

(58) Field of Classification Search ........... 365/185.18, 365/185.24, 185.28
See application file for complete search history.

(56) References Cited

U.S. PATENT DOCUMENTS 5,402,370 A    3/1995    Fazio et al.
2005/0105337 A1*    5/2005    Cohen et al. .......... 365/185.18

FOREIGN PATENT DOCUMENTS

JP    9-502828 A    3/1997

OTHER PUBLICATIONS

Mukherjee, S. et al. (1985). "A Single Transistor EEPROM Cell and its Implementation in a 512K CMOS EEPROM," *IEDM Technical Digest* 85:616-619.

* cited by examiner

*Primary Examiner*—Son Dinh
*Assistant Examiner*—Douglas King
(74) *Attorney, Agent, or Firm*—Morrison & Foerster LLP

(57) ABSTRACT

A method for determining programming voltage of a nonvolatile memory in which any variation in the threshold voltage at the memory cell after programming by hot carrier injection can be suppressed includes the steps of: setting the drain voltage to an initial setting level; applying the drain voltage and a gate voltage at a predetermined programming time; shifting the drain voltage to another setting level; reprogramming the memory cell with the another setting level of the drain voltage; measuring the threshold voltage of the memory cell; and determining a differential represented by a ratio of a change in the threshold voltage to a change in the drain voltage at the threshold voltage after the reprogramming, whereby when the determined differential and the measured threshold voltage remain within their respective permissible ranges, the setting determined by the shifting step is defined as an optimum level of the drain voltage.

7 Claims, 8 Drawing Sheets

METHOD FOR DETERMINING PROGRAMMING VOLTAGE OF NONVOLATILE MEMORY

CROSS REFERENCE TO RELATED APPLICATION

This Nonprovisional application claims priority under 35 U.S.C. §119(a) on Patent Application No. 2004-299575 filed in Japan on Oct. 14, 2004, the entire contents of which are hereby incorporated by reference.

BACKGROUND OF THE INVENTION

1. Field of the Invention

The present invention relates to a method for programming of a nonvolatile memory which includes an array of memory cells for storage of data on the basis of the number of carriers accumulated between the control gate and the channel region and particularly to a method for determining programming voltage in order to the optimum level of a drain voltage provided for programming the memory cells by hot carrier injection.

2. Description of the Related Art

A typical example of the nonvolatile memory is a flash erasable, electrically programmable read-only memory (flash EEPROM) including an electrically insulated MOS gate called a floating gate (see "A Single Transistor EEPROM Cell and Implementation in 512k CMOS EEPROM" by S. Mukherjee et. al, IEDM Technical Digest, p. 616, 1985).

FIG. 1 illustrates a memory cell structure of such a conventional flash EPROM. The structure has a layer arrangement where the floating gate 1 is disposed to control directly a channel 2 and store data (electrons) and a control gate 4 is stacked over the floating gate 1 via an insulating layer 3. As apparent from an equivalent circuit shown in FIG. 2, the floating gate 1 is isolated from the external terminals by the insulating layer and its potential is controllably determined by capacitance coupling of the four external terminals. As the data writing operation is based on the mechanism of hot carrier phenomenon which is equal to the principle of writing operation on an ultraviolet ray erasable EPROM, it allows the electrons to be loaded with a higher level of energy than the barrier height of a tunnel gate oxide layer 5 serving as the insulating layer and injected in the floating gate 1. The erasing operation based on the mechanism of Fowler-Nordheim tunnel phenomenon involves releasing the electrons across the tunnel oxide layer 5 of an overlap region between the floating gate 1 and the source diffusion 6. This can control the number of electrons in the floating gate 1. The reading operation which is equal to that of a common NOR type MOS memory involves sensing a difference in the driving current for the accumulated data (the number of electrons) in each memory cell selectively activated through the bit line (drain 7) and the word line (control gate 4).

When the hot carrier phenomenon is used as the mechanism of carrier injection, the current received by the floating gate 1 is expressed by the following equation (1), as described in the lucky electron model of "Solid-State Electron 2" by W. Shockley, 1961:

$$Ig = Is \times \exp(-\phi b / Esd / \lambda) \quad (1)$$

where Ig is the gate supplying current, Is is the source current, $\phi b$ is the barrier height, Esd is the source/drain electric field, and $\lambda$ is the scattering mean free path of hot electrons.

It is thus apparent that the hot carrier current (Ig) depends largely on the source/drain electrical field (Esd). In the actual memory cell array, the source/drain electrical field (Esd) is significantly affected by the drain source voltage, the load resistance in the drain current path, and the effective channel length in a memory cell transistor. Those parameters may be varied depending on the degree of process error in each memory array chip. It is hence necessary that the drain voltage provided by the control circuit for programming is set with its optimum level at each chip.

For the purpose, a method for measuring the program characteristics of the memory cell in each chip and determining an optimum of the programming voltage from the measurements is disclosed in Japanese Published Patent Publication No. 09-502828 (WO 95/07536). As disclosed in this publication, the method is adopted for determining the programming drain voltage in a nonvolatile memory. As shown in the flowchart of FIG. 3, the method comprises the steps of:

(a) determining a first value which presents the first level of the programming drain voltage;

(b) feeding a programming drain voltage generator circuit in the nonvolatile memory with the first value to generate the programming drain voltage from the first value;

(c) selecting a plurality of memory cells in the nonvolatile memory and applying the programming drain voltage to the plurality of the memory cells for a predetermined length of time for programming;

(d) measuring a threshold voltage at one of the memory cells of the group after the programming;

(e) comparing the measurement of the threshold voltage with a range of programmed threshold voltages in the nonvolatile memory;

(f) shifting the programming drain voltage by repeating the steps (b) to (e) with changing the first value to another when the measurement of the threshold voltage is out of the range of the programmed threshold voltages; and (g) storing the first value in the nonvolatile memory for generating the programming drain voltage from the first value so that the nonvolatile memory is programmed with the range of the threshold voltages within the predetermined length of time for programming when the measurement of the threshold voltage remains within the range of the programmed threshold voltages and constantly controlling the programming drain voltage generator circuit.

As described, the conventional attempt determines the programming drain voltage so that the nonvolatile memory is programmed with the range of the threshold voltages within the predetermined length of time for programming but fails to discuss the following drawbacks.

More specifically, the load resistance developed in the path from the programming drain voltage generator circuit to each nonvolatile memory cell may be different depending on the location or address of a target point in the array of the nonvolatile memory cells. This is derived from the fact that the construction of interconnecting extending from the programming drain voltage generator circuit to the target nonvolatile memory cell is varied in the length and the material depending on the location or address of a target point in the array of the nonvolatile memory cells. In other words, when the programmable drain voltage is released at a uniform level from the programming drain voltage generator circuit, it may actually be varied from one memory cell to another by the effect of a change in the load resistance of the path or the current activating capability of the memory cell.

FIG. 4 illustrates the relationship between the drain voltage as a base data and the threshold voltage after programming according to the present invention. As shown, a curve (a) indicates that the threshold voltage after programming increases greater than the drain voltage does. Another curve (b) indicates that the threshold voltage after programming is moderately increased as compared with the drain voltage.

In the programming by hot carrier injection, the threshold voltage after programming depends mainly on three factors: (1) drain voltage, (2) gate voltage, and (3) log scale pulse time. When the programming pulse width is constant, the threshold voltage after application of the programming pulse is hardly affected by the threshold voltage prior to programming, provided that the threshold voltage before application of the programming pulse is not higher than the voltage level determined by the three factors. Whenever the erasing operation is inserted or not between any two adjacent writing operations with the drain voltage, the relationship shown in FIG. 4 remains the same.

The prior art allows the threshold voltage in the nonvolatile memory cell after programming to be significantly varied in response to an actual change in the programming drain voltage from one memory cell to another in a single chip when the programming drain voltage remains in a range denoted by the curve (a) even if it has been set to an initial level satisfying the programming time. This will cause variations in the programming speed, the threshold voltage after programming, and the margin of the reliability.

SUMMARY OF THE INVENTION

The present invention has been developed in view of the above drawbacks and its object is to provide a programming voltage determining method of a nonvolatile memory where variations in the threshold voltage at the memory cell after the programming due to the hot carrier injection can be suppressed.

For achievement of the above object of the present invention, a method for determining programming voltage in order to set the drain voltage with an optimum level applied to the programming operation for memory cells by hot carrier injection in a nonvolatile memory which includes the memory cells for storing information on the basis of the number of carriers accumulated between the control gate and the channel region includes the steps of: setting the drain voltage to an initial setting level; programming the memory cell through applying the drain voltage and a gate voltage to the drain and the control gate respectively of the memory cell at a predetermined programming time; shifting the drain voltage to another setting level; reprogramming the memory cell with the another setting level of the drain voltage determined in the shifting step; measuring the threshold voltage of the memory cell after the programming operation in the programming step or the reprogramming step; and determining a differential represented by a ratio of a change in the threshold voltage to a change in the drain voltage at the threshold voltage after the reprogramming step, wherein when the differential determined in the determining step and the threshold voltage measured in the measuring step remain within their respective permissible ranges, the setting determined in the shifting step is defined as an optimum level of the drain voltage.

The method according to the present invention allows the differential determined in the determining step and the threshold voltage measured in the measuring step to be controlled within their respective permissible ranges so that the drain voltage for conducting the programming operation can be held in a saturated range denoted by a curve (b) in the relationship between the drain voltage and the threshold voltage after programming, shown in FIG. 4. Accordingly, a variation in the threshold voltage after programming which results from a change in the drain voltage applied to the drain of the memory cell which derives from the manufacturing process or design can favorably be suppressed.

In the setting of the drain voltage for programming with the hot carrier injection, the following two restrictive facts are encountered. The drain voltage shall hence remain in a range not disturbed by the facts.

(1) When the drain voltage is too low, the hot carriers receive a short of energy from the drain electric field and thus fail to pass over the barrier height of a gate oxide layer, declining the programming speed, (2) When the drain voltage is too high, the bit line is charged with the drain voltage and unselected cells connected to the bit line in the array receive a disturbing stress during the programming operation, whereby the margin to disturbed error will significantly be declined.

The method according to the present invention allows the drain voltage for conducting the programming operation to be held within a favorable setting range which is free from the above described two restrictive facts. As the result, the programming operation on the nonvolatile memory can be speeded up and conducted without declining the margin to disturbing error.

Also, the method according to the present invention may be modified in which when at least one of the differential determined in the determining step and the threshold voltage measured in the measuring step is out of its permissible range, the shifting step, the reprogramming step, the measuring step and the determining step are repeated. This allows the drain voltage for conducting the programming operation to be set to an optimum level.

The method according to the present invention may be modified in which the drain voltage determined in the setting step is a minimum of the absolute in the range of changes in the drain voltage derived from the manufacturing process and memory cell array designing for conducting the programming operation.

The method according to the present invention may be modified in which the permissible range of the differential is from 1.0 to 4.0.

The method according to the present invention may be modified in which the permissible range of the threshold voltage is not smaller than a reference level substantially equal to a threshold voltage used for the program verification.

DETAILED DESCRIPTION OF THE INVENTION

A method and device for determining a programming voltage for a nonvolatile memory according to the present invention (referred to as a "method of the present invention" and an "device of the present invention" respectively hereinafter) will be described in more detail referring to the relevant drawings.

Figure 1:
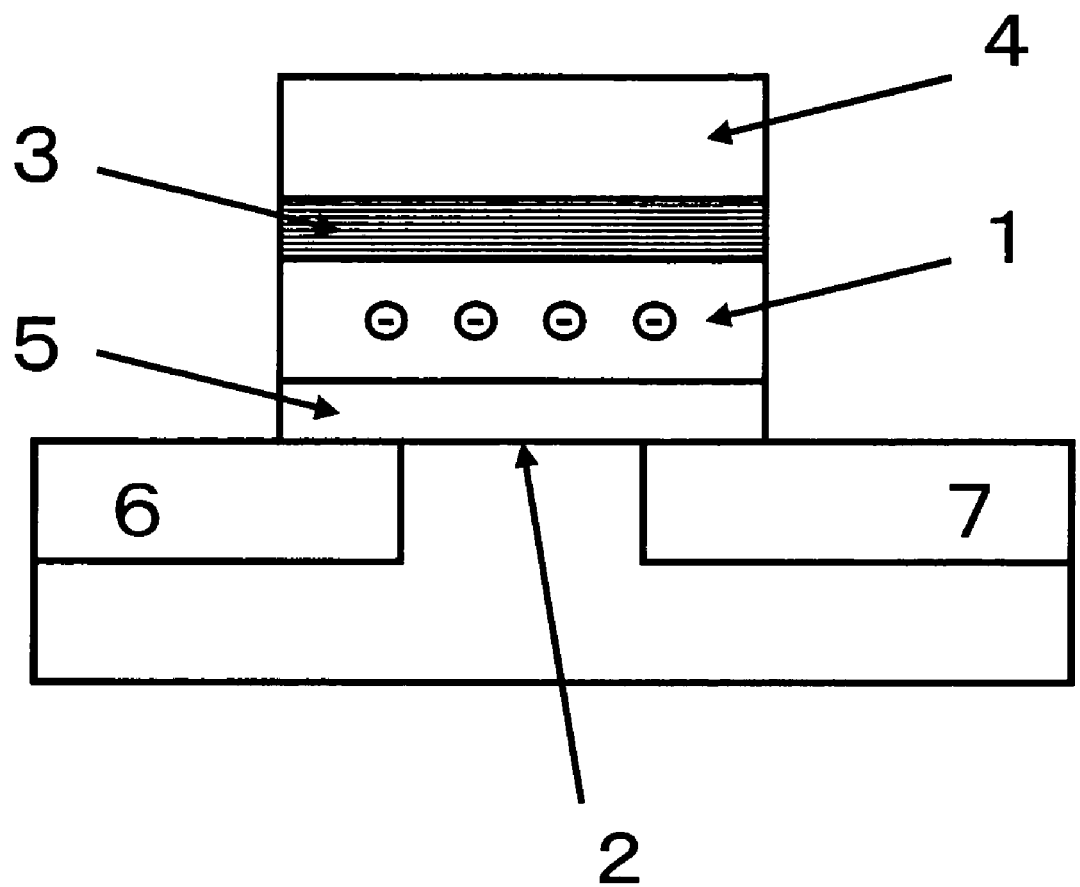
FIG. 1 is an elementary cross sectional diagram schematically showing a memory cell structure of a conventional flash EPROM.
Figure 2:
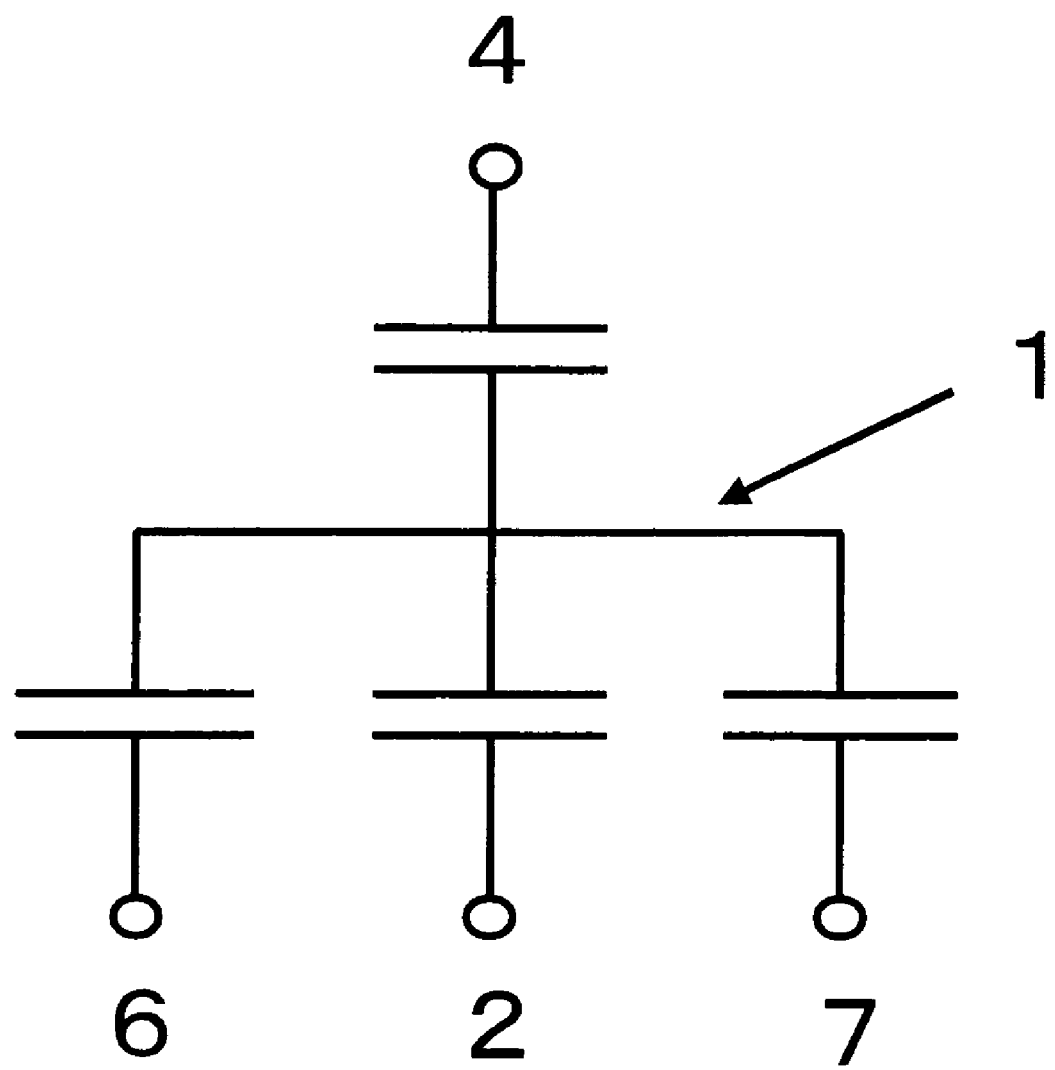
FIG. 2 is an equivalent circuitry diagram of the memory cell structure of the conventional flash EEPROM shown in FIG. 1.
Figure 3:
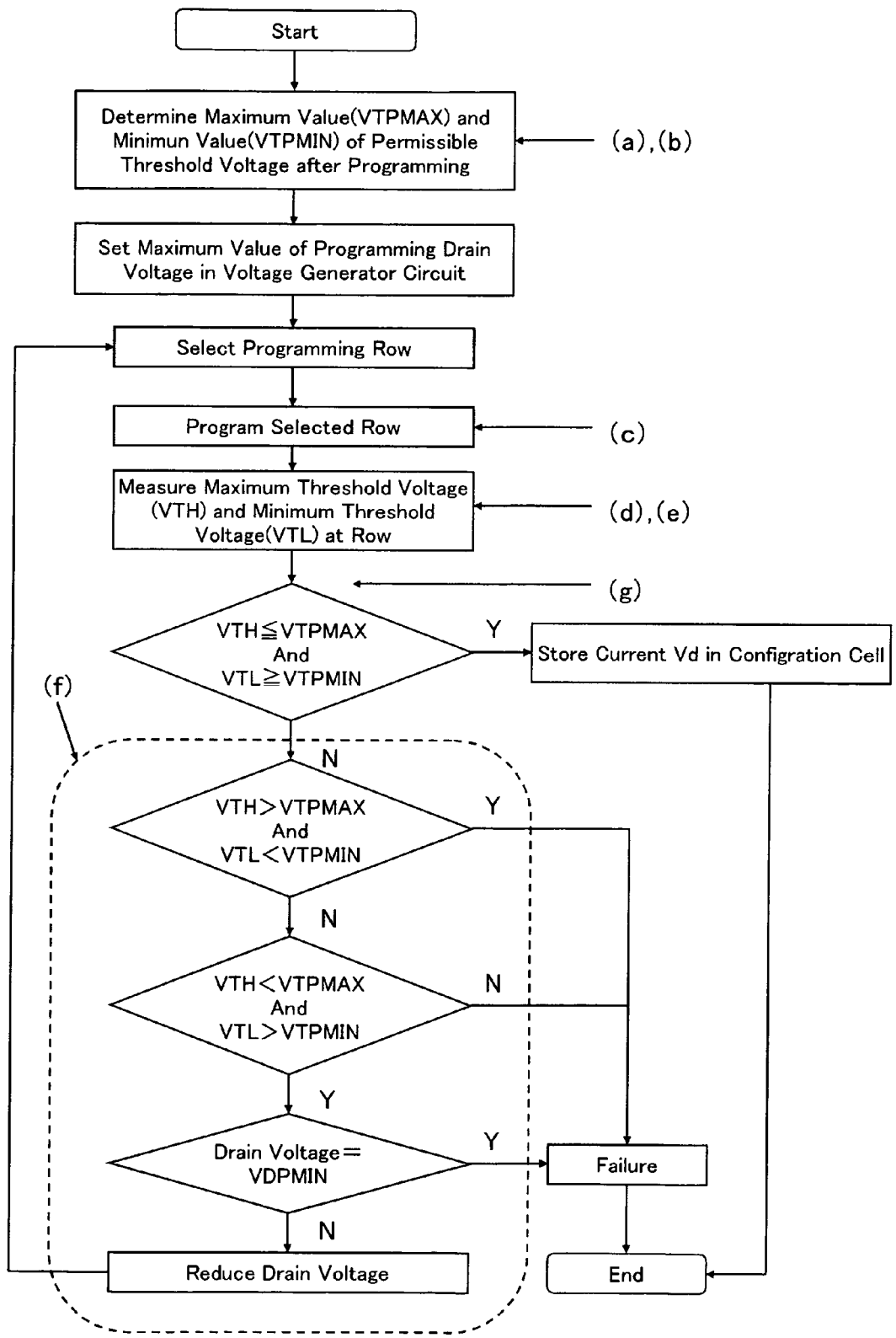
FIG. 3 is a flowchart showing a procedure of determining the drain voltage for programming in the prior art.
Figure 7:
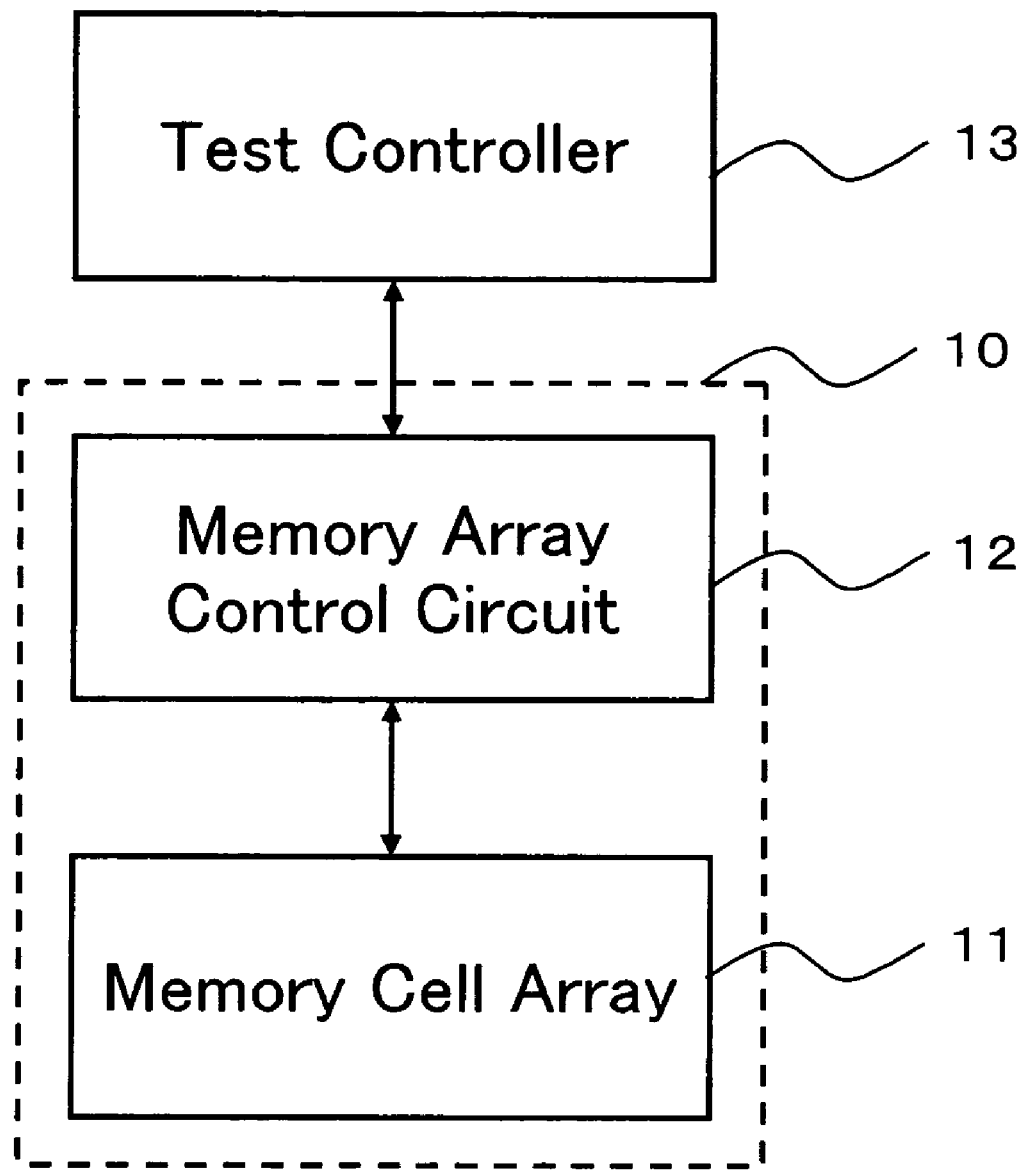
FIG. 7 is a block diagram showing a system combination of a nonvolatile memory subjected to the programming voltage determining method of the present invention and a programming voltage determining device according to the present invention.

As shown in FIG. 7, a nonvolatile memory 10 to which the method of the present invention is applied comprises a memory cell array 11 having an array of flash memory cells, of which the structure is identical to that shown in FIG. 1 and a memory array control circuit 12 consisting mainly of an address decoder, a voltage generator circuit, a timing control circuit, a sense amplifier and others for carrying out memory operations (programming, erasing, reading) on each memory cell in the memory cell array 11. The memory array control circuit 12 in the nonvolatile memory 10 is connected to a test controller 13 arranged for collaborating with the memory array control circuit 12 to conduct the method of the present invention. Since the test controller 13 functions as a controller device for controlling steps of the method of the present invention, it is thus identical to the device of the present invention.

Figure 5:
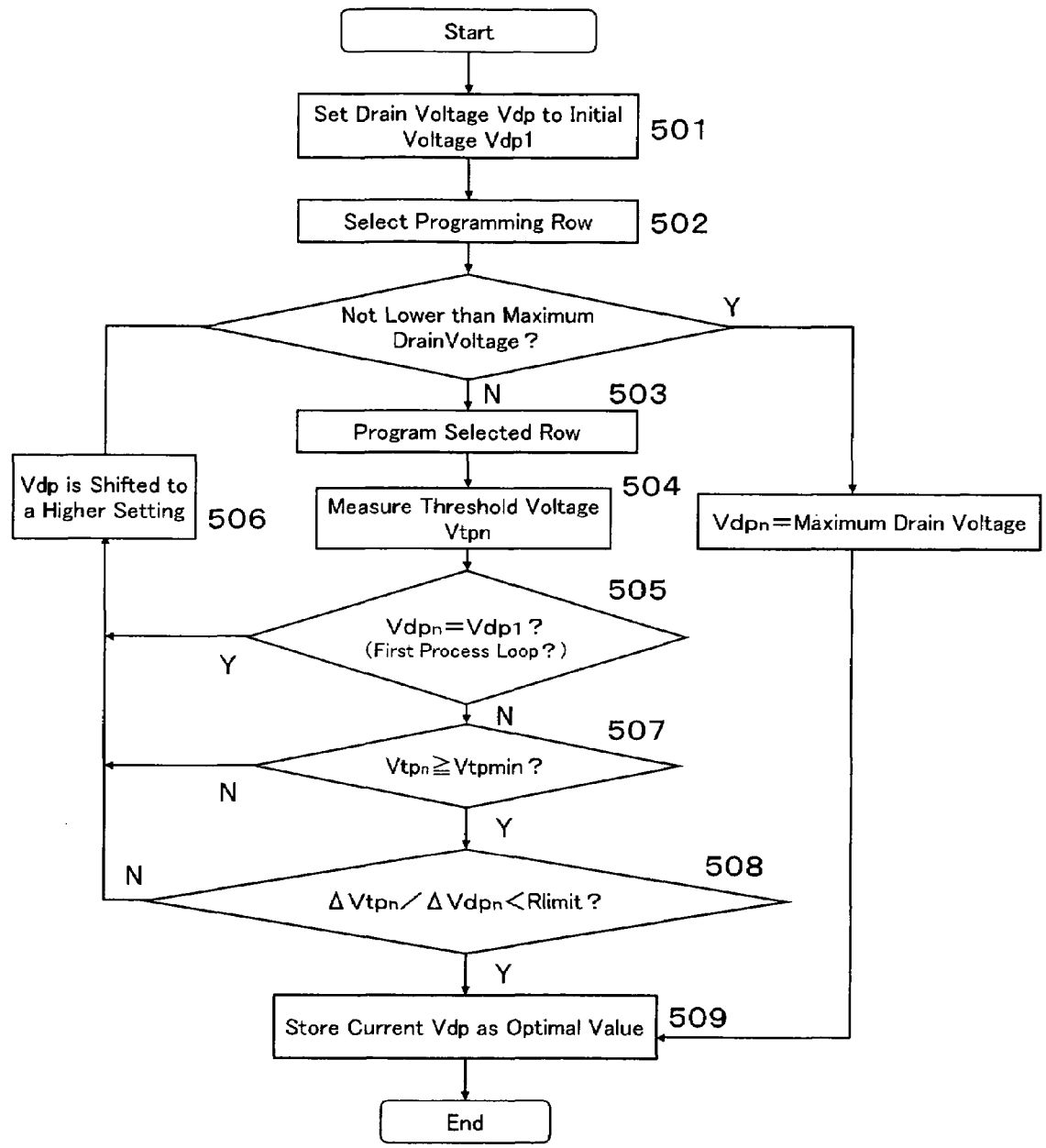
FIG. 5 is a flowchart showing a procedure of determining the programming voltage for a nonvolatile memory according to one embodiment of the present invention.

The method of the present invention of which the steps are controlled by the test controller 13 will now be described in more detail referring to a flowchart shown in FIG. 5.

The method starts with the test controller 13 setting the drain voltage to an initial level $Vdp_1$ (step 501, a setting step). More specifically, the initial drain voltage $Vdp_1$ is 3.8 V in this embodiment. This level is preferably equal to a minimum of the drain voltage for programming within a range of predictable errors pertinent to the manufacturing process and the design. The programming drain voltage generator circuit in the memory array control circuit 12 is then set with the initial level of the programming drain voltage.

This is followed by selecting the bit (memory cell) at a desired address (step 502). The bit may be a single specific bit or a plurality of bits assigned with a condition which satisfies a specific requirement.

The drain voltage $Vdp_1$ is loaded at the programming time under a particular gate voltage condition to start the programming operation (step 503, a programming step). The operations of the steps 503 to 508 are repeated until the requirement, described later, is satisfied by shifting the programming drain voltage from the initial level $Vdp_1$ to $Vdp_2$, $Vdp_3$, . . . and $Vdp_n$ (step 506, a shifting step). In the second or higher turn, step 503 (the programming step) acts as a reprogramming step. In step 506 (the shifting step), the programming drain voltage is increased by a predetermined value, which is equivalent to a margin of the drain voltage for conducting the programming operation, e.g., 0.1 to 0.2 V in the embodiment. The predetermined value may be either constant or not.

In the embodiment, no erasing operation is needed between any two adjacent programming operations with different levels of the drain voltage. The erasing operation may be inserted. In any case whether the erasing operation is inserted or not, the relationship between the drain voltage and its threshold after the programming operation remains unchanged as apparent from FIG. 4, thus permitting no significant difference in the result. The method of the present invention evaluates a gradient of the profile curve (FIG. 4) of the threshold voltage in relation to the drain voltage. Accordingly, even when the threshold voltage after the writing operation with the drain voltage is different between the presence and the absence of the erasing operation, it will hardly disturb the measurement of the drain voltage.

For determining the specific address, a group of bit addresses at the highest of the resistance in the drain voltage path during the programming operation is selected in this embodiment. As the voltage drop due to the drain current during the programming operation and the load resistance at the path is most significant in the group of bit addresses, the drain voltage output for driving needs to be highest at the output of the drain voltage drive circuit. In the embodiment, the address of 2 to 16 bits is selected for example.

After the operation of step 503, the threshold voltage $Vtp_n$ at the memory cell after the n-th programming operation is read (step 504, a measuring step). At the first process loop, the threshold voltage $Vtp_1$ at the memory cell after the initial programming operation is read.

The means for measuring the threshold voltage at the memory cell is implemented by the memory cell array control circuit 3 including a means for setting and reading from the test controller 13 the word line voltage level at the reading operation and the test controller 13 including a means for reading the drain current at the memory cell while scanning the word line voltage level.

After the operation of step 504, it is examined whether the processing loop is the first one or not (step 505). The first process loop, the drain voltage is set with the initial level $Vdp_1$. In the first process loop, the operation is not advanced to steps 507 and 508 but involves recording the drain voltage and the measurement of the threshold voltage after programming and then shifting the setting of the drain voltage from $Vdp_1$ to $Vdp_2$ (step 506) and carrying out the reprogramming operation with the shifted setting of the drain voltage (step 503). This is followed by reading the threshold voltage $Vtp_2$ at the memory cell after the second programming operation.

On or after the second process loop, the operation moves to step 507 depending on the result of examination in step 505. As explained below, the examination (1) is conducted in step 507 and the examination (2) is conducted in step 508 (a determining step) in a succession.

(1) The examination whether the measured threshold voltage $Vtp_n$ falls within a permissible range or not.

(2) The detection of a differential expressed by a ratio of a change in the threshold voltage $Vtp_n$ after the reprogramming operation to a change in the drain voltage (see the equation (2) below) and the examination whether the differential ($\Delta Vtp_n/\Delta Vdp_n$) is within a predetermined permissible range.

$$\Delta Vtp_n/\Delta Vdp_n = (Vtp_n - Vtp_{n-1})/(Vdp_n - Vdp_{n-1}) \qquad (2)$$

The predetermined permissible range depicted in the examination (1) is defined by a minimum level $Vtp_{min}$ of the threshold voltage at the memory cell which is essential for preventing the bit (memory cell) programmed with the drain voltage $Vdp_n$ from being judged to be in the erased state. In the embodiment, the level is equal to the threshold voltage for the program verification at the memory array control circuit 12.

When it is judged in step 507 that the threshold voltage $Vtp_n$ is out of the range (i.e. the threshold voltage $Vtp_n$ is smaller than the lower limit $Vtp_{min}$) or in step 508 that the differential ($\Delta Vtp_n/\Delta Vdp_n$) is out of the range (e.g., the differential ($\Delta Vtp_n/\Delta Vdp_n$) is not smaller than the upper limit $R_{limit}$), the operation moves to step 506 where the drain voltage is shifted to a higher setting. When the drain voltage is lower than the maximum level, the operations of steps 503 to 508 are repeated. When the drain voltage after the shifting is not lower than the maximum level, the maximum level of the drain voltage is set to $Vdp_n$ and the operation advances to step 509.

Figure 4:
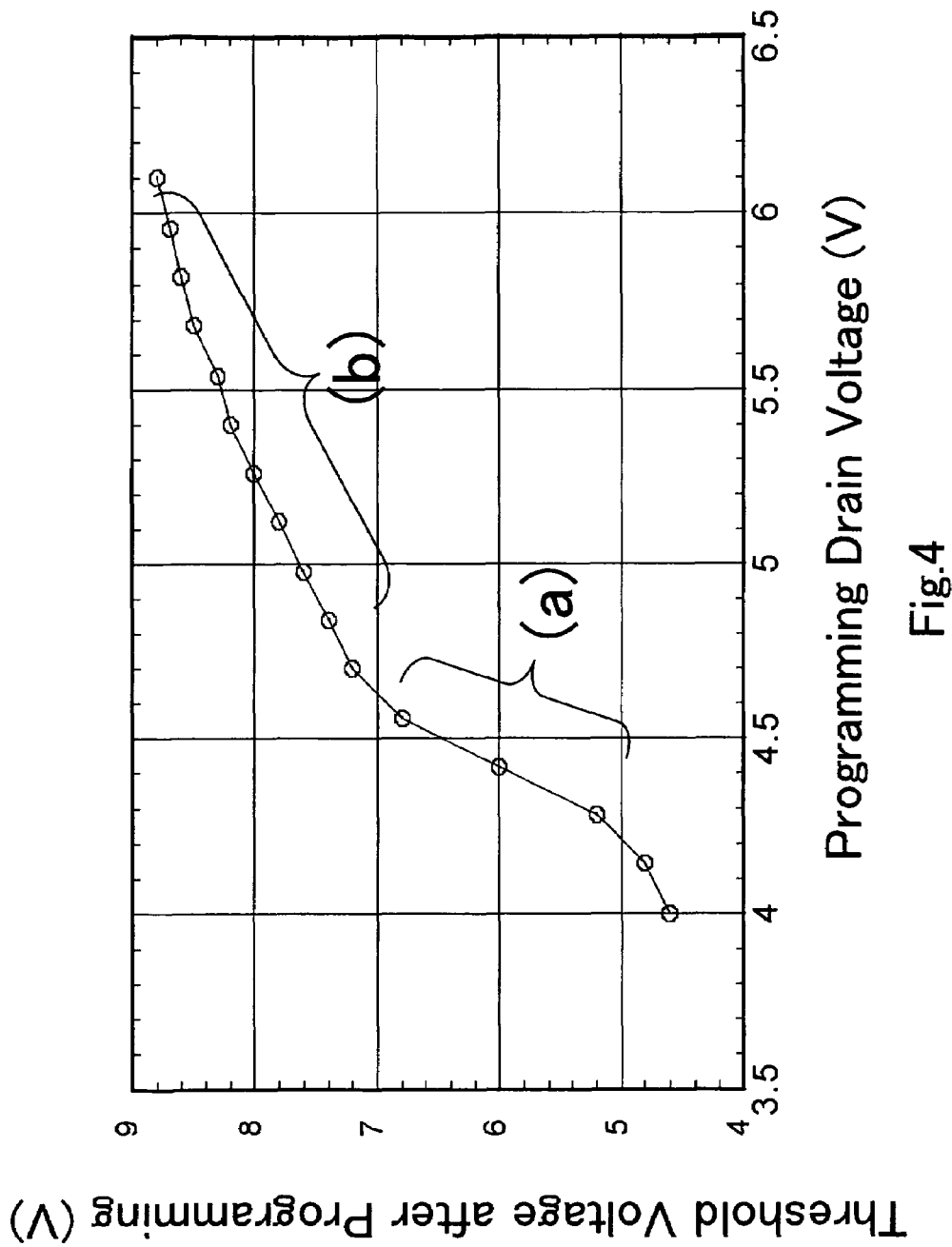
FIG. 4 is a characteristic diagram showing the relationship between the drain voltage and the threshold voltage after programming in the programming with hot carrier injection.

As the process loop from step 503 to step 508 has been repeated two or more times, the relationship between the drain voltage for programming and the threshold voltage after the programming at the memory cell becomes as shown in FIG. 4. The relationship exhibits a sharp curve (a) at the beginning and then a moderate curve (b). The curve (b) indicates that the hot carrier injection takes place while the drain voltage remains at a maximum setting for inhibiting secondary breakdown with the on current at the selected memory cell at the programming operation and the negative feedback derived from the load resistance in the drain current path. The negative feedback means that when the drain at the memory cell is in a preceding step just before the secondary breakdown and the drain current Idp at the memory cell is increased, the voltage drop $Vd_{drop}$ from the following equation (3) with the load resistance $R_{path}$ in the drain current path is provided and the current increasing is suppressed.

$$Vd_{drop} = Idp \times R_{path} \quad (3)$$

When the programming operation is carried out with the curve (b) of the drain voltage, its voltage remains stable thus allowing the writing operation at higher efficiency. Also, for avoiding the impact to the reliability or the disturbing of the drain voltage to unselected cells, the lowest of the drain voltage has to be calculated along the curve (b).

Figure 6:
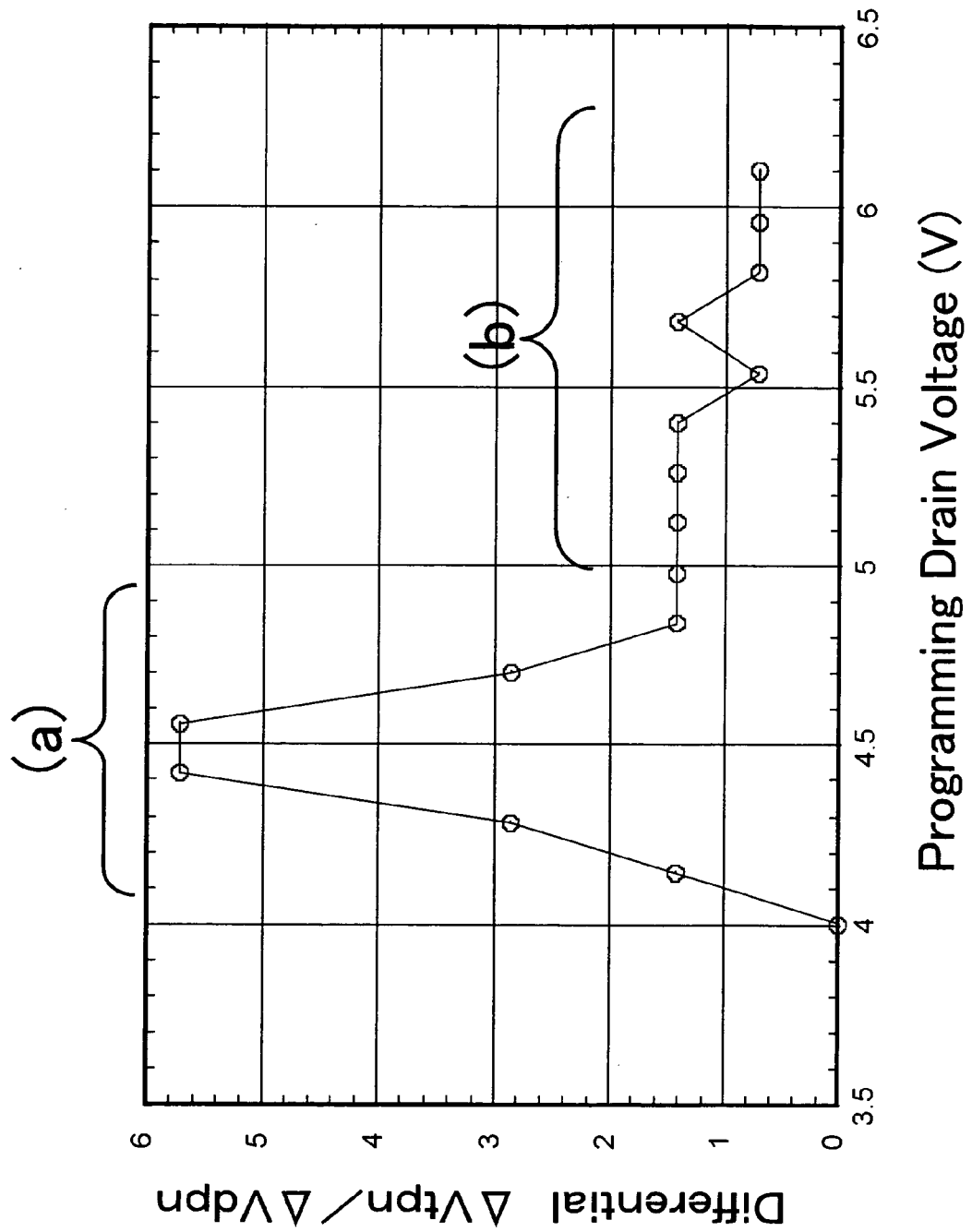
FIG. 6 is a characteristic diagram showing the relationship between the drain voltage and the differential ($\Delta Vtp_n/\Delta Vdp_n$) determined by the programming voltage determining method for a nonvolatile memory according to the present invention.

This is implemented by examining the relationship between the drain voltage and the differential ($\Delta Vtp_n/\Delta Vdp_n$) expressed by the equation (2) as shown in FIG. 6. As apparent from the relationship between the drain voltage and the differential shown in FIG. 6, the peak of the differential falls in a range represented by the curve (a) shown in FIG. 4. When the drain voltage increases, the differential remains significantly low in a range represented by the curve (b) shown in FIG. 4.

More particularly, as the drain voltage Vdp is simply increased from the initial level, the differential ($\Delta Vtp_n/\Delta Vdp_n$) reaches its peak and then drops down to not higher than 4.0. According to the present invention, it is hence judged that when the differential turns to a range from 1.0 to 3.0, the drain voltage produces a curve (b) making the threshold voltage after the programming stable. This operation is identical to the examining operation in step 508. Also, when the examination (1) in step 507 judges that the threshold voltage $Vtp_n$ after the programming is not smaller than the minimum level $Vtp_{min}$ for the program verification, the drain voltage $Vdp_n$ at the programming operation remains optimum allowing the negative feedback along the drain current path to be conducted favorably and a change in the threshold voltage at the memory cell essential for conducting the programming operation to be maintained. Finally, the optimum of the drain voltage is saved as a normal programming requirement in the memory array control circuit 12 (step 509).

Another embodiment of the present invention will be described.

Figure 8:
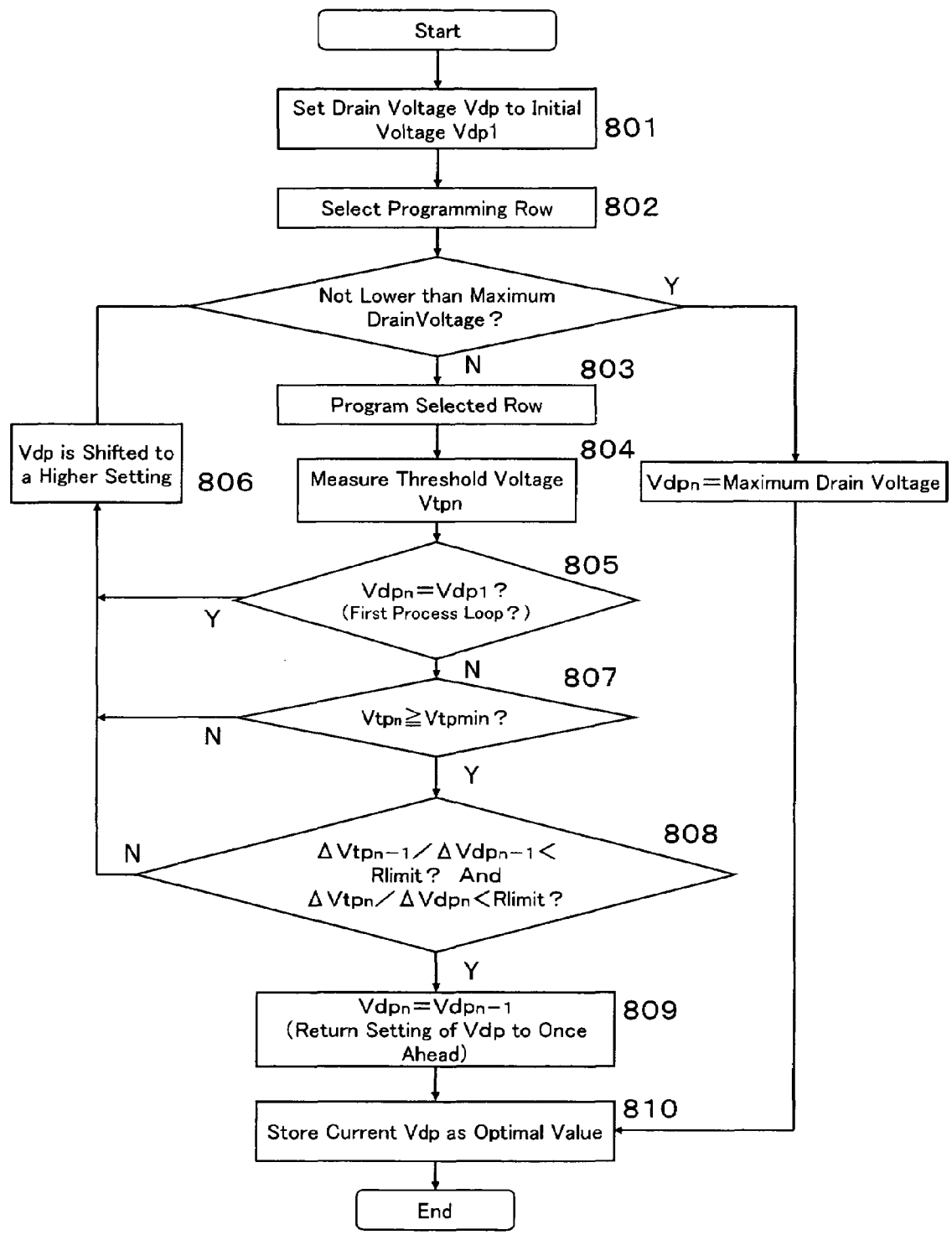
FIG. 8 is a flowchart of operations showing another embodiment of the programming voltage determining method for a nonvolatile memory of the present invention.

The examination in step 508 of the previous embodiment may be replaced by step 808 (step 508 in FIG. 5) where, as shown in FIG. 8, two consecutive levels of the drain voltage Vdp are examined as denoted in the examination (2) whether or not their differentials stay within the range before the optimum of the drain voltage Vdp is selected.

Although the above two embodiments are based on the drain voltage Vdp simply increasing when the hot carriers are electrons, the present invention will cover an alternative that the hot carrier are holes. In the latter case, the programming over the hot hole injection can be conducted with equal success by the method of the present invention simply decreasing the drain voltage Vdp.

Generally, the test controller 13 shown in FIG. 7 is provided as a test device separated from the chip product. The test controller 13 may be installed partially or entirely as a test circuit in the nonvolatile memory 10 of a chip form.

Although the present invention has been described in terms of a prefer red embodiment, it will be appreciated that various modifications and alterations might be made by those skilled in the art without departing from the spirit an d scope of the invention. The invention should therefore be measured in terms of the claims which follow.

What is claimed is:

1. A method for determining programming voltage in order to set the drain voltage with an optimum level applied to the programming operation for memory cells by hot carrier injection in a nonvolatile memory which includes the memory cells for storing information on the basis of the number of carriers accumulated between the control gate and the channel region, the method comprising the steps of:

setting the drain voltage to an initial setting level;

programming the memory cell through applying the drain voltage and a gate voltage to the drain and the control gate respectively of the memory cell for a predetermined programming time;

shifting the drain voltage to another setting level;

reprogramming the memory cell with the another setting level of the drain voltage determined by the shifting step;

measuring the threshold voltage of the memory cell after the programming operation in the programming step or the reprogramming step; and determining a differential represented by a ratio of a change in the threshold voltage to a change in the drain voltage at the threshold voltage after the reprogramming step, wherein when the differential determined in the determining step and the threshold voltage measured in the measuring step remain within their respective permissible ranges, the setting level determined in the shifting step is defined as an optimum level of the drain voltage.

2. The method according to claim 1, wherein when at least one of the differential determined in the determining step and the threshold voltage measured in the measuring step is out of its permissible range, the shifting step, the reprogramming step, the measuring step and the determining step are repeated.

3. The method according to claim 1, wherein
the drain voltage determined in the setting step is a minimum of the absolute in the range of changes in the drain voltage for conducting the programming operation, the change derived from the manufacturing process and memory cell array designing.

4. The method according to claim 1, wherein
the permissible range of the differential is from 1.0 to 4.0.

5. The method according to claim 1, wherein
the permissible range of the threshold voltage is not smaller than a reference level substantially equal to a threshold voltage used for the program verification.

6. A device for determining programming voltage in order to set the drain voltage with an optimum level applied to the programming operation for memory cells by hot carrier injection in a nonvolatile memory which includes the memory cells for storing information basis of the number of carriers accumulated between the control gate and the channel region, the device comprising:

control means for controlling the operations of the setting step, the programming step, the shifting step, the reprogramming step, the measuring step and the determining step of the method according to claim 1.

7. A nonvolatile memory comprising:
a plurality of memory cells; and
the programming voltage determining device according to claim 6, wherein
the memory cell can be programmed by hot carrier injection into a region between a control gate and a channel region and stores data in the form of carriers accumulated in the region.

* * * * *